(12) United States Patent
Lin

(10) Patent No.: US 6,390,106 B1
(45) Date of Patent: May 21, 2002

(54) MULTIDIRECTIONAL LIQUID SPRAYER USED IN A WET PROCESS

(75) Inventor: Yu-Min Lin, Taipei (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 09/534,540

(22) Filed: Mar. 27, 2000

(30) Foreign Application Priority Data

Oct. 29, 1999 (TW) .......................................... 88118833

(51) Int. Cl.[7] ................................................. B08B 3/02
(52) U.S. Cl. ...................... 134/172; 134/180; 134/181; 239/265; 239/237; 239/227
(58) Field of Search ........................ 134/122 R, 64 R, 134/172, 180, 181, 199; 239/227, 264, 263.3, 98, 236, 237, 588, 242, 229, 244

(56) References Cited

U.S. PATENT DOCUMENTS

| | | | | |
|---|---|---|---|---|
| 3,210,010 A | * | 10/1965 | Delapena | |
| 3,266,502 A | * | 8/1966 | Copeland | |
| 3,391,701 A | * | 7/1968 | Richardson et al. | |
| 3,892,250 A | * | 7/1975 | Miko | |
| 3,899,903 A | * | 8/1975 | Lapierrre | |
| 3,907,204 A | * | 9/1975 | Przystawik | |
| 3,955,588 A | * | 5/1976 | Born | |
| 4,027,433 A | * | 6/1977 | Hockett | |
| 4,037,560 A | * | 7/1977 | Lutz et al. | |
| 4,076,033 A | * | 2/1978 | Busse et al. | |
| 4,231,239 A | * | 11/1980 | Lazaroff | |
| RE31,792 E | * | 1/1985 | Colomer | |
| 4,516,760 A | * | 5/1985 | Stumpf | |
| 4,691,723 A | * | 9/1987 | Mierswa et al. | |
| 4,872,238 A | * | 10/1989 | Crotts et al. | |
| 4,967,962 A | * | 11/1990 | Kawaguchi et al. | |
| 5,037,672 A | * | 8/1991 | Daussan et al. | |
| 5,176,158 A | * | 1/1993 | Ketelhohn et al. | |
| 5,284,297 A | * | 2/1994 | Kubacak et al. | |
| 5,387,313 A | * | 2/1995 | Thoms | |
| 6,112,754 A | * | 9/2000 | Bradley | |
| 6,143,122 A | * | 11/2000 | Mossbeck et al. | |
| 6,145,521 A | * | 11/2000 | Wu | |
| 6,155,245 A | * | 12/2000 | Zanzuri | |

* cited by examiner

Primary Examiner—Frankie L. Stinson
(74) Attorney, Agent, or Firm—Winston Hsu

(57) ABSTRACT

The present invention relates to a liquid sprayer. The liquid sprayer has a housing with a hollow inner shell. Within the inner shell are a plurality of transfer pipes, each with a nozzle installed on its lower end, a linking device fixed to the plurality of transfer pipes for moving the transfers pipes so that the nozzles are directed to spray in the same direction, and a driving device for driving the linking device in different directions. Hence, the nozzles are able to spray a workpiece in different directions with time.

9 Claims, 9 Drawing Sheets

MULTIDIRECTIONAL LIQUID SPRAYER USED IN A WET PROCESS

BACKGROUND OF THE INVENTION

1. Field of the Invention

The present invention relates to a liquid sprayer, and more particularly, to a multidirectional sprayer used in wet processes, such as cleaning, developing, and etching processes.

2. Description of the Prior Art

Liquid sprayers are used in a variety of wet semiconductor processes, such as cleaning, developing and etching processes. A prior art wet process liquid sprayer comprises a housing shell, a transport line for moving workpieces through the housing shell, and a spray system installed above the transport line in the housing shell.

The spray system comprises a plurality of parallel horizontal rocker pipes rotatably installed in the housing shell, each rocker pipe having a plurality of parallel nozzles directed in a generally downward direction. The spray system further includes driving and linkage devices to produce synchronized oscillation (rocking) of the rocker pipes so that all nozzles spray in the same direction at any given time. Due to continuing complexity and diversity of workpieces, such as plasma display panel (PDP) substrates, a liquid sprayer that has only one-direction nozzle aiming (rocking motion) becomes increasingly inefficient. Multidirectional nozzle aiming, therefore, improves process efficiency.

Please refer to FIG. 1 and FIG. 2. FIG. 1 is a side view of a prior art wet process liquid sprayer. FIG. 2 is a schematic diagram of a liquid supply system 20 and workpieces 34, 36. As shown in FIG. 1, the liquid sprayer 10 comprises a housing 12, the liquid supply system 20 used to transfer a liquid 26 onto the workpieces 34, 36. A transport line 30 is used to move and support the workpieces 34, 36 along a first horizontal direction, and a driving device (not shown) provides the spraying motion of the liquid sprayer 10. The liquid supply system 20 comprises a plurality of supply pipes 22 installed along a second horizontal direction, and a plurality of nozzles 24 mounted on the underside of the supply pipes 22. The transport line 30 comprises a plurality of rollers 32 to move the workpieces 34, 36 along the first horizontal direction in the housing 12.

The transport line 30 moves the workpieces 34, 36 along the first horizontal direction, which is perpendicular to the orientation of the supply pipes 22. Each supply pipe 22 is driven by the driving device and rotates in a reciprocating manner as indicated by the arrow 28 in FIG. 1. The nozzles 24 rotate with the supply pipes 22, and so the liquid 26 from the nozzles 24 is sprayed onto the workpieces 34, 36 in a reciprocating manner along the first horizontal direction.

The workpieces 34, 36 may be respectively the front and the rear glass plates of a plasma display panel. As shown in FIG. 2, the first workpiece 34 has parallel electrodes 35 that is parallel to the first horizontal direction. The second workpiece 36 has parallel electrodes 37 that is parallel to the second horizontal direction. The workpiece 34 moves into the housing 12 to be sprayed. Because the orientations of the parallel electrodes 35 and the motion of the nozzles 24 are both in the first horizontal direction, the residual chemical liquid on the workpiece 36 is easily washed away, making the chemical reaction more efficient. However, when the workpiece 36 moves into the housing 12, the orientation of the parallel electrodes 37 is perpendicular to the direction of the spraying motion of nozzles 24, and residual chemical liquid on the workpiece 36 is not easily washed away. Therefore, the workpiece 36 must remain in the spraying region for a longer period of time to ensure process completion. This increases both process time and the amount of chemical liquid used, which leads to higher process costs.

Furthermore, in the liquid sprayer 10, the supply pipe 22 is connected to the main pipe 21 with a sealing ring (not shown). The sealing ring is required as the supply pipes 22 rotate along the direction of the arrow 28, shown in FIG. 2. However, the sealing ring is not perfect, and the connections 23 between the supply pipes 22 and the main pipes 21 often have some leakage.

SUMMARY OF THE INVENTION

It is therefore a primary objective of the present invention to provide a multidirectional liquid sprayer to solve the above mentioned problems.

In a preferred embodiment, the present invention relates to a liquid sprayer comprising:

- a housing comprising a hollow inner shell, and a transport line installed on a bottom portion of the inner shell for horizontally supporting a workpiece;
- a plurality of transfer pipes vertically installed on an upper portion of the inner shell, and a nozzle installed at a lower end of each transfer pipe to spray a liquid in a downward direction;
- a linking device fixed to the plurality of transfer pipes for moving the plurality of transfers pipe so that the nozzles are directed to spray in the same direction back and forth along different directions; and
- a driving device fixed in the housing and used to drive the linking device in different directions so that the nozzles spray onto the workpiece in different directions with time.

It is an advantage of the present invention that the liquid sprayer drives the nozzles to spray in different directions, which improves the efficiency of the liquid sprayer.

This and further objectives of the present invention will become obvious to those of ordinary skill in the art after reading the following detailed description of the preferred embodiment, which is illustrated in the various figures and drawings.

DETAILED DESCRIPTION OF THE PREFERRED EMBODIMENTS

Figure 1:
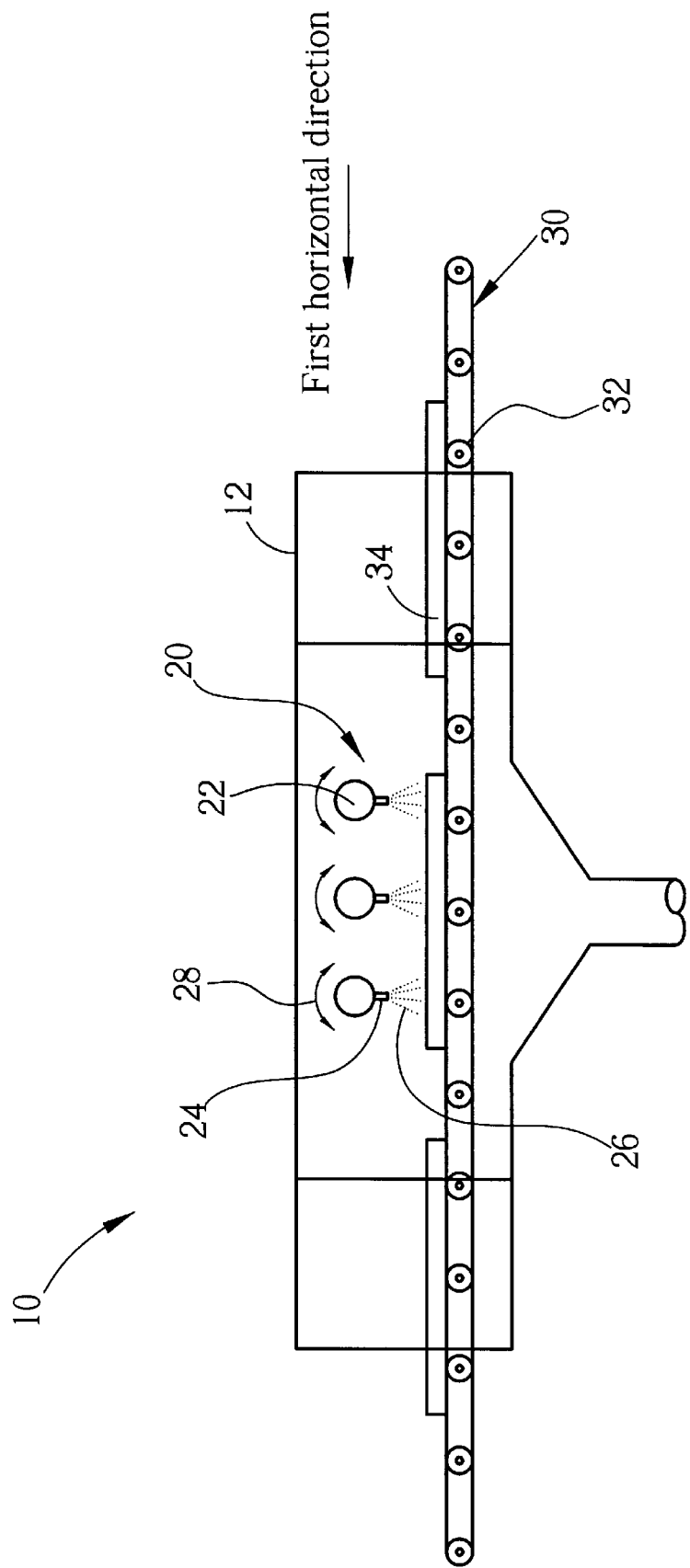
FIG. 1 is a side view of a prior art wet process liquid sprayer.
Figure 2:
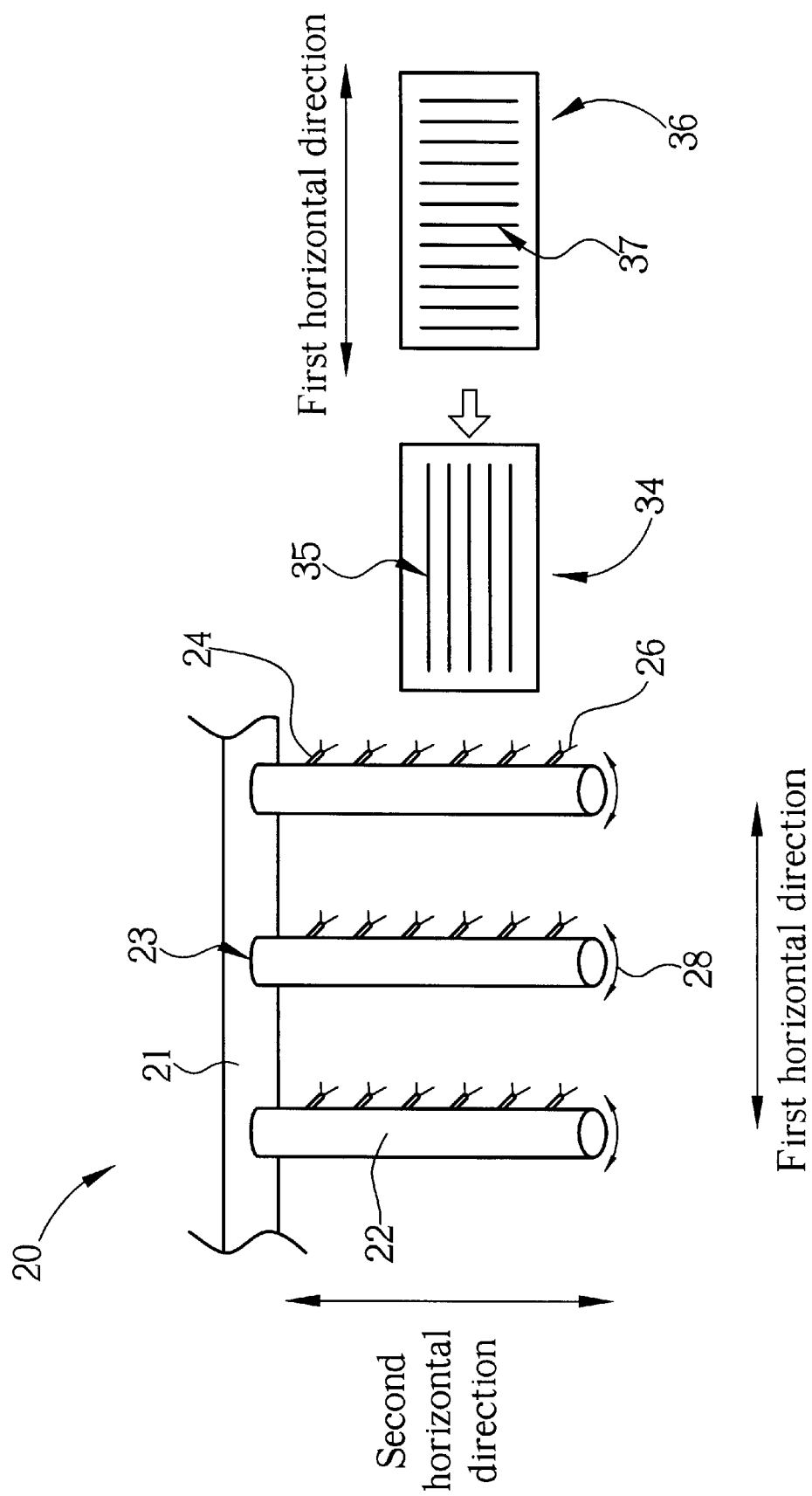
FIG. 2 is a schematic diagram of the liquid supply system 20 and the workpieces 34, 36.
Figure 3:
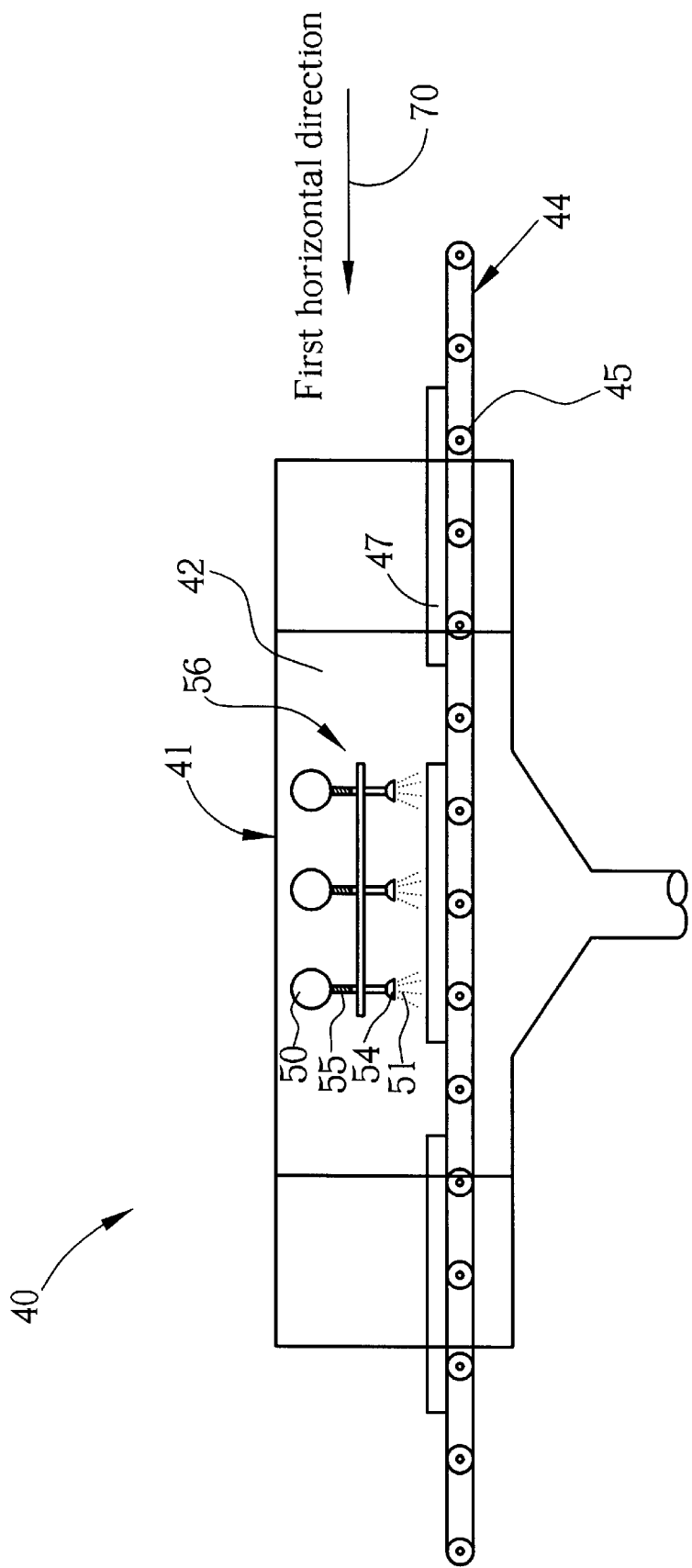
FIG. 3 is a side view of a wet process liquid sprayer according to the present invention.
Figure 4:
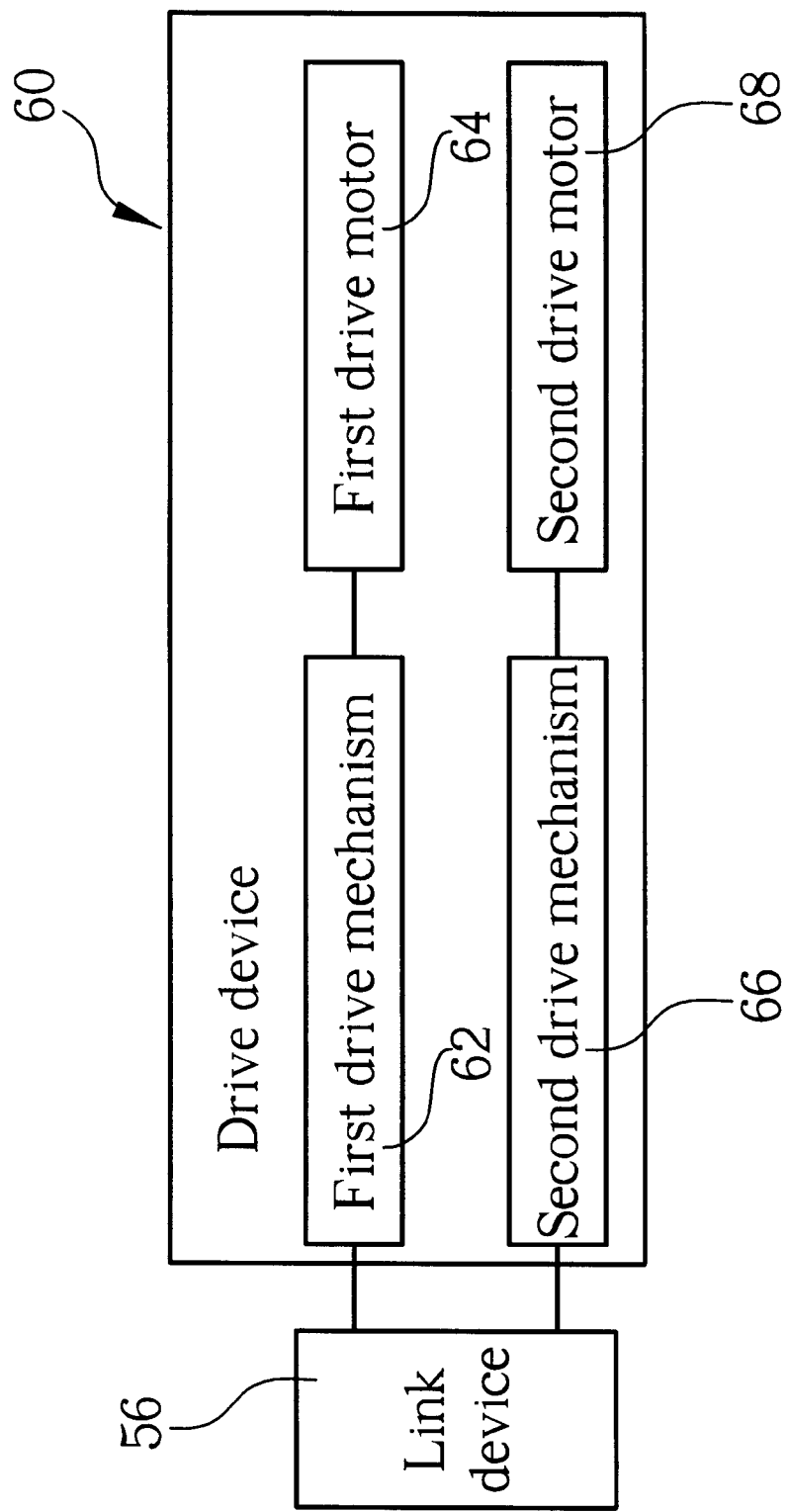
FIG. 4 is a functional block diagram of the driving device of a liquid sprayer according to the present invention.

Please refer to FIG. 3 and FIG. 4. FIG. 3 is a side view of a wet process liquid sprayer according to the present invention. FIG. 4 is a functional block diagram of the liquid sprayer according to the present invention.

As shown in FIG. 3, a liquid sprayer 40 has a housing 41 with a hollow inner-shell 42. A transport line 44, working as a supporting means, is horizontally installed on the inner shell 42 for supporting a workpiece 47. The liquid sprayer 40 further comprises a plurality of horizontal cylindrical pipes 50 and vertical transfer pipes 55 installed on the inner shell 42 above the transport line 44 for transporting a liquid 51 onto the workpiece 47. Each transfer pipe 55 has a nozzle 54 installed at its lower end to spray the liquid 51. Each transfer pipe 55 is connected to, and thereby obtains the liquid 51 from, one of the cylindrical pipes 50. A linking device 56 is fixed to the plurality of transfer pipes 55, and is used to move the plurality of transfer pipes 55 so that the nozzles 54 are all directed to spray back and forth along different directions. A driving device 60 (shown in FIG. 4) is set within the housing 41. The transport line 44 comprises a plurality of rollers 45, which move the workpiece 47 along the first horizontal direction past the transfer pipes 55.

Figure 5:
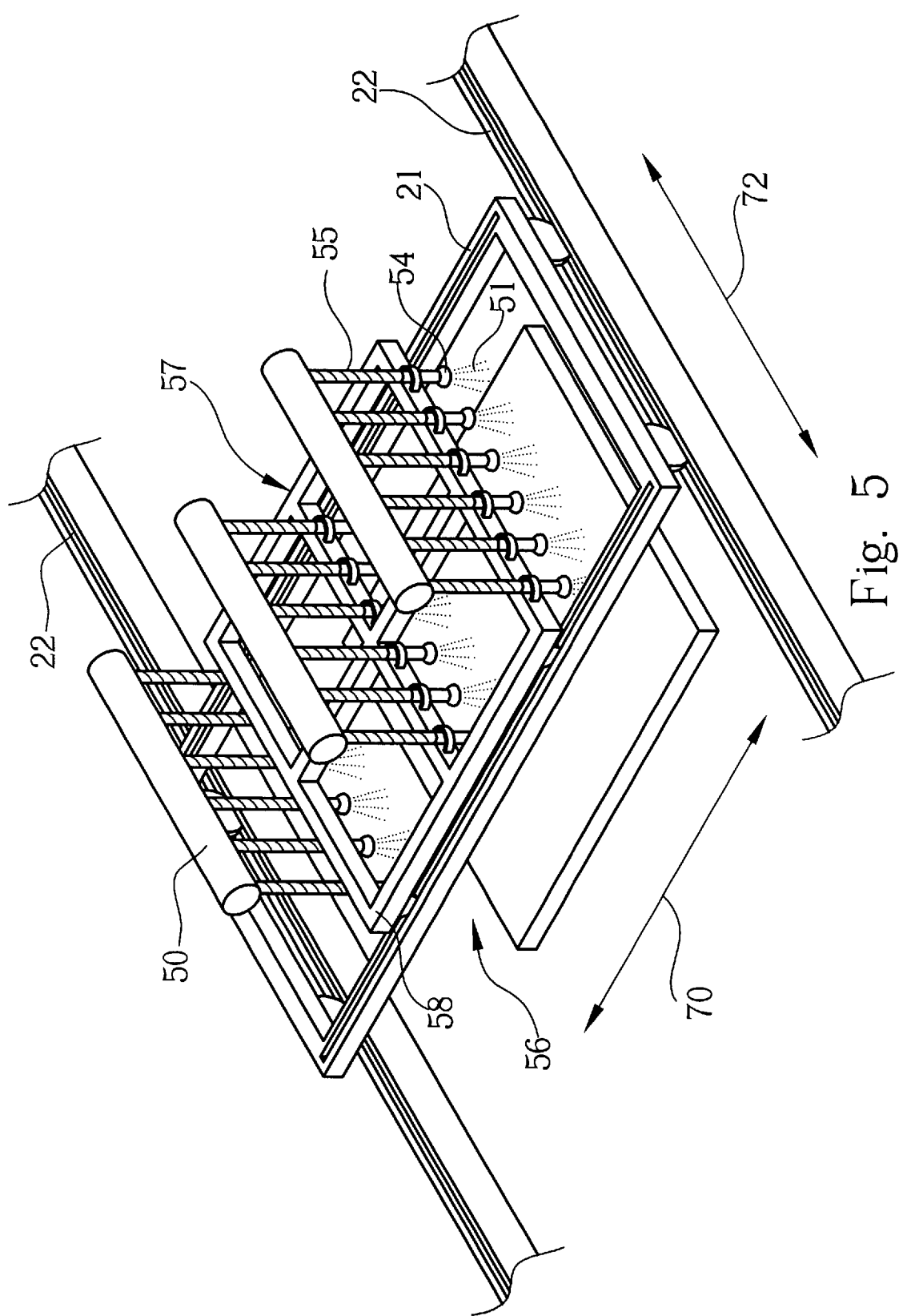
FIG. 5 is a perspective view of the spraying motion of the liquid sprayer.

Consider FIG. 4 and FIG. 5. The driving device 60 comprises a first drive mechanism 62, a first drive motor 64, a second drive mechanism 66 and a second drive motor 68. The first drive mechanism 62 and the second drive mechanism 66 are both connected to the linking device 56. The first drive mechanism 62 drives the linking device 56 in a reciprocating manner along the first horizontal direction 70. The second drive mechanism 66 drives the linking device 56 in a reciprocating manner along the second horizontal direction 72. The first horizontal direction 70 is perpendicular to the second horizontal direction 72.

A switch (not shown) is used to selectively activate the first drive mechanism 62 and the first drive motor 64, or the second drive mechanism 66 and the second drive motor 68. The first drive motor 64 drives the first drive mechanism 62, moving the linking device 56 and thus driving the transfer pipes 55 and the nozzles 54 in a reciprocating manner along the first horizontal direction 70, then the liquid 51 from the nozzles 54 will be sprayed onto the workpiece 47 along the first horizontal direction 70. Similarly, the second drive mechanism 66 moves the linking device 56, driving the transfer pipes 55 and the nozzles 54 in a reciprocating manner along the second horizontal direction 72, then the liquid 51 will then be sprayed onto the workpiece 47 along the second horizontal direction 72.

The first embodiment is shown in FIG. 5. The linking device 56 includes a rectangular frame 57 with a plurality of fixing bars 58, a first track 21, and a second track 22. A first drive device (not shown) is fixed at the first track 21, and a second drive device (not shown) is fixed relative to the second track 22. The first and second drive devices can be a combination of a motor, a flywheel, and a link pole. The lower end of the transfer pipes 55 are fixed to the fixing bars 58.

The rectangular frame 57 is slidably mounted on the first track 21, and the first track 21 is slidably mounted on the second track 22. The rectangular frame 57 can be driven by the first drive device to slide on the first track 21 along the first direction 70, or driven by the second drive device to slide on the second track 22 along the second direction 72. During the movement of the rectangular frame 57, the rectangular frame 57 moves the plurality of transfer pipes 55 and directs the nozzles 54 to spray in the same direction.

Figure 6:
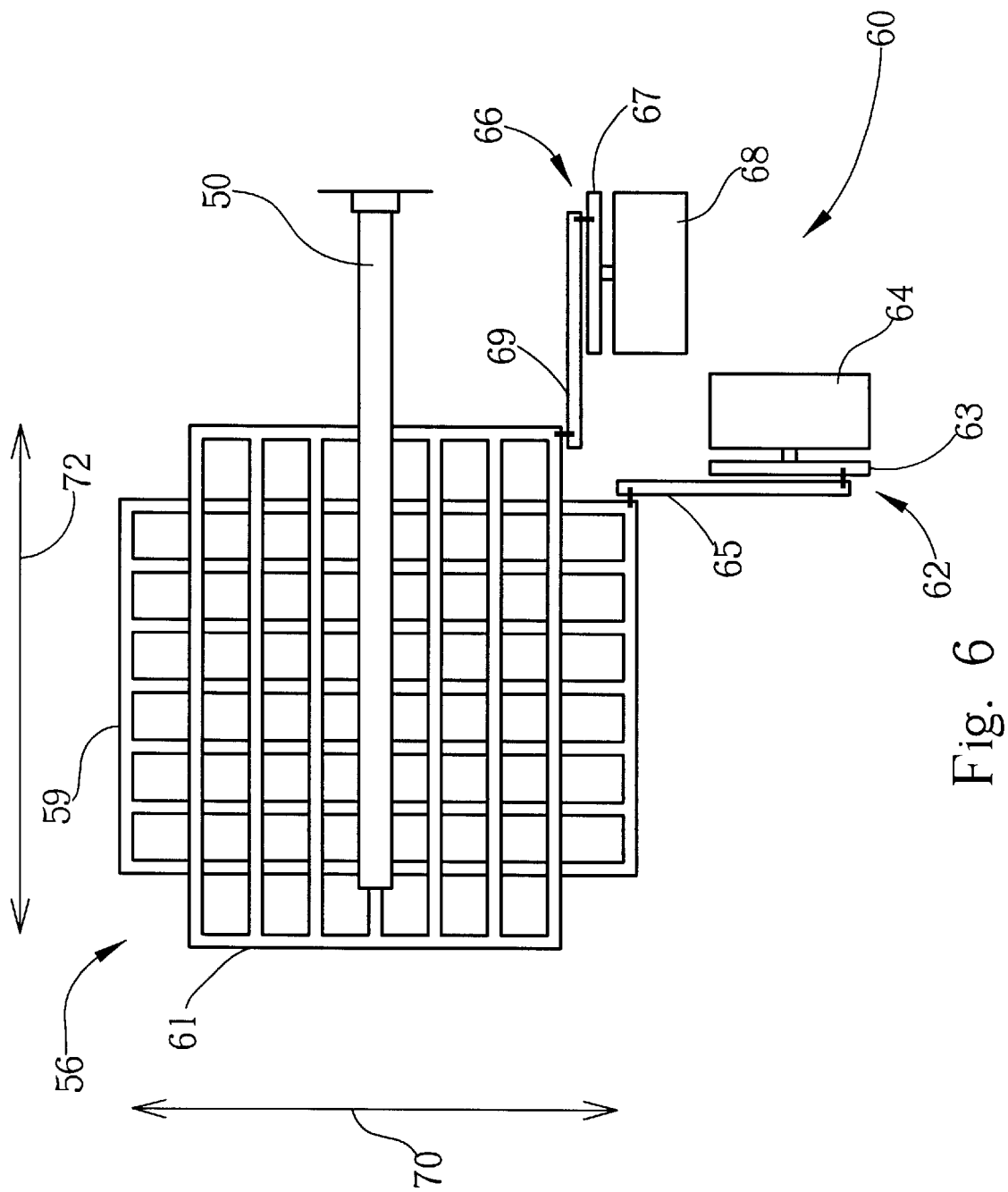
FIG. 6 is a schematic diagram of a linking device and a driving device in an alternative structure of the present invention.

Please refer to FIG. 6. FIG. 6 is a top-view schematic diagram of a second embodiment of this invention. The linking device 56 comprises a first fixing frame 59 and a second fixing frame 61. The first drive mechanism 62 comprises a flywheel 63 and a link pole 65. One end of the link pole 65 is connected to the linking device 56. The other end of the link pole 65 is connected to the outer edge of the flywheel 63. The first drive motor 64 rotates the first flywheel 63, moving the link pole 65, and thus driving the first fixing frame 59 in a reciprocating manner along the first horizontal direction 70. Similarly, the second drive mechanism 66 comprises a flywheel 67 and a link pole 69. One end of the link pole 69 is connected to the linking device 56 and the other end of the link pole 69 is connected to the flywheel 67. The second drive motor 68 rotates the flywheel 67 and moves the link pole 69, so that the second fixing frame 61 is moved in a reciprocating manner along the second horizontal direction 72.

Figure 7:
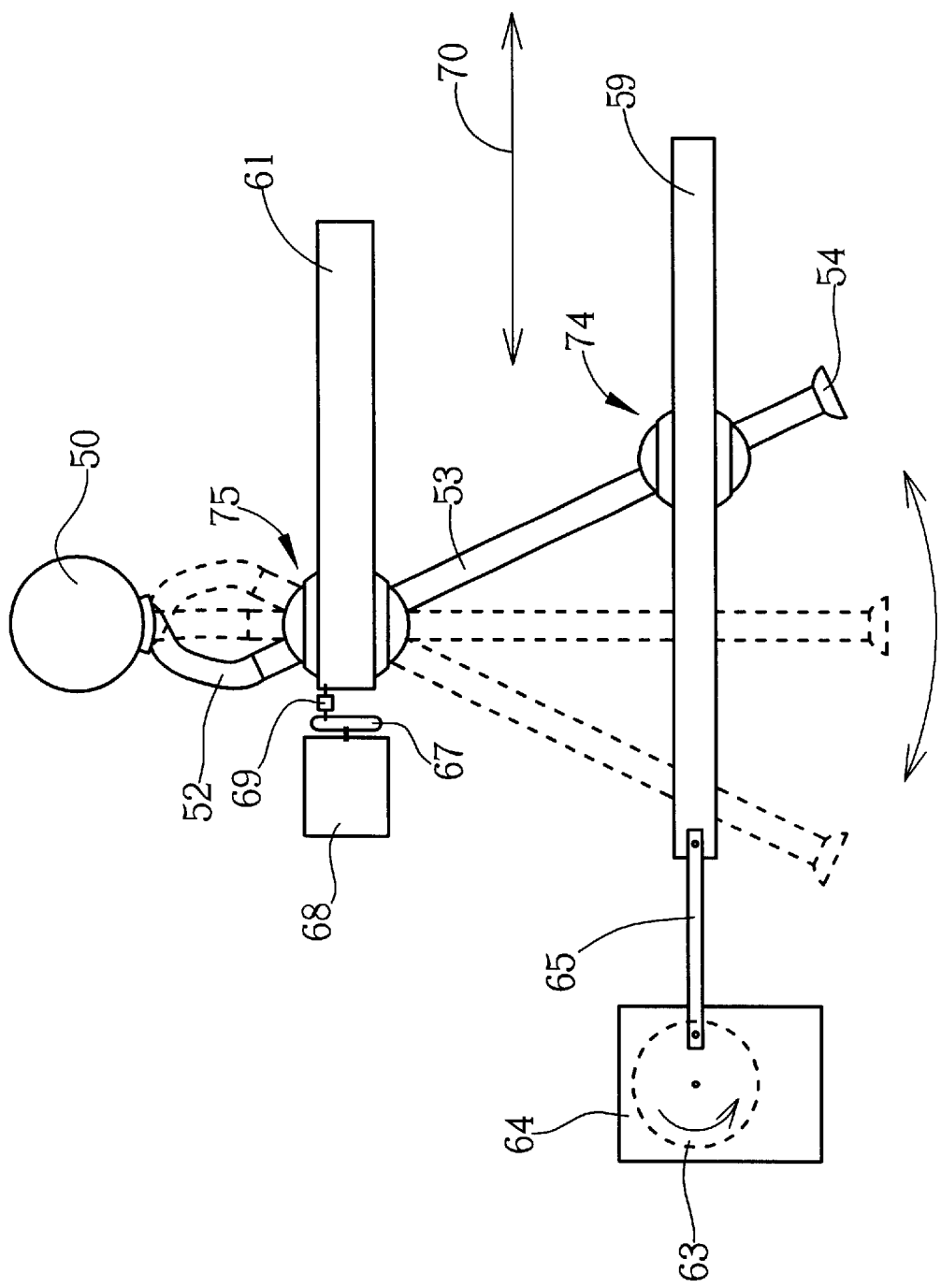
FIG. 7 is a side view of the motion of a first fixing frame driven by a driving device in the alternative structure.
Figure 8:
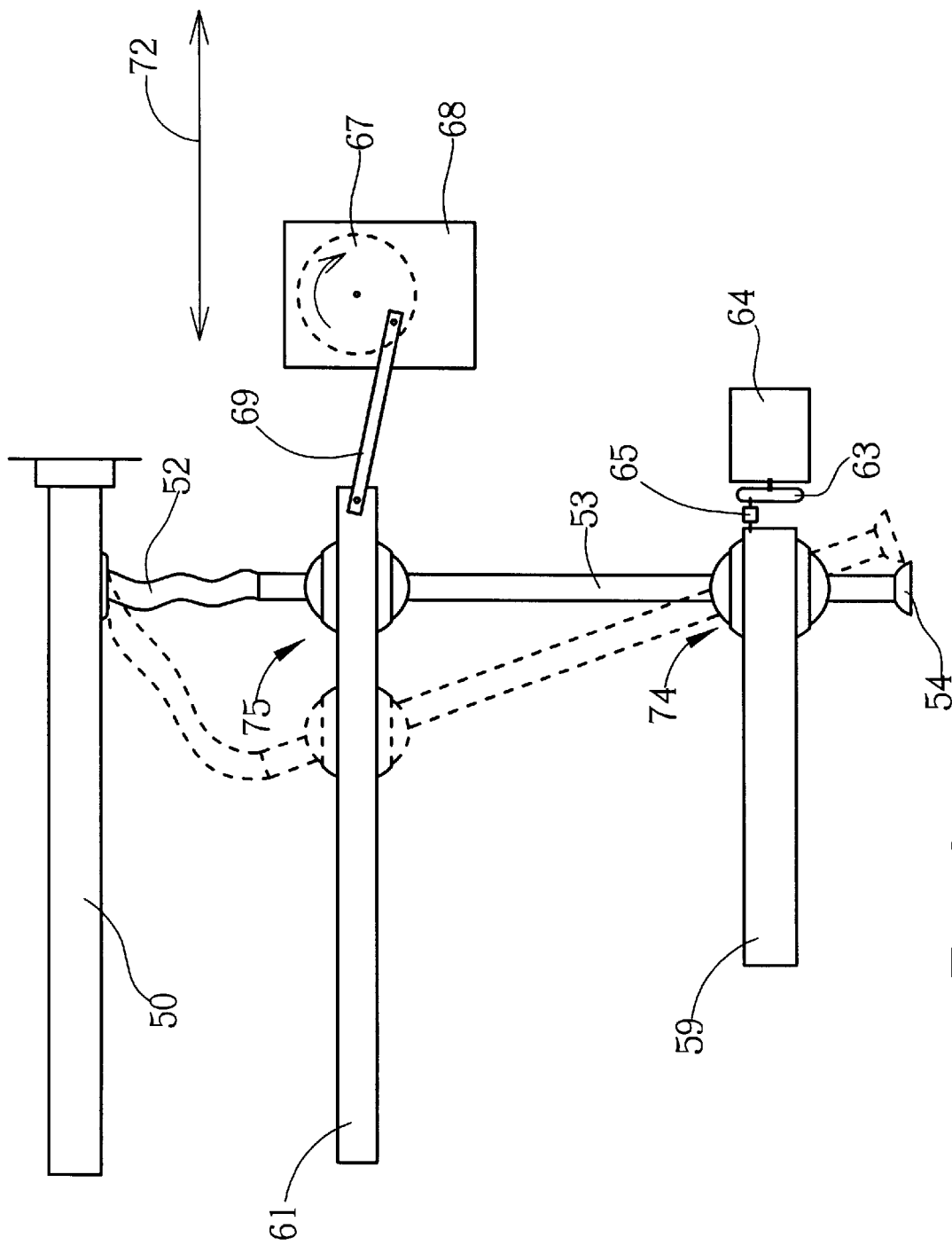
FIG. 8 is a side view of the motion of a second fixing frame driven by a driving device in the alternative structure.

Please refer to FIG. 7 and FIG. 8. FIG. 7 is a side view of the motion of the first fixing frame 59 driven by the first driving mechanism 62. FIG. 8 is a side view of the motion of the second fixing frame driven by the second driving mechanism 66. The transfer pipe has two parts. The first part is a flexible pipe 52 connected between the cylindrical pipe 50 and the second fixing frame 61. The second part is a rigid connection pipe 53 connected between the first fixing frame 59 and the second fixing frame 61. Hence, the liquid 51 flows through the cylindrical pipe 50, the flexible pipe 52, and the rigid connection pipe 53 to the nozzle 54. The upper end of the rigid connection pipe 53 is mounted on the second fixing frame 61 by a universal bearing 75. The lower end of the rigid connection pipe 53 is mounted on the first fixing frame 59 by another universal bearing 74. One of these two universal bearings is used to establish a rotable but not slidable connection between the second fixing frame 61 and the connection pipe 53; and the other universal bearing is used to establish a rotable and slidable connection between the first fixing frame 59 and connection pipe 53. The connection pipe 53 is used as a pivot for the relative motion between the first fixing frame 59 and the second fixing frame 61. During the relative motion between the first fixing frame 59 and the second fixing frame, the connection pipe 53 can slide along its length through the universal bearing 74.

As shown in FIG. 7, the connection pipe 53 uses the universal bearing 74 to rotate and slide relative to the first fixing frame 59, and it uses the universal bearing 75 to rotate but not slide relative to the second fixing frame 61. When the first drive motor 64 rotates the flywheel 63, moving the link pole 65, the first fixing frame 59 will move in a reciprocating manner along the first horizontal direction. The lower portion of the connection pipe 53 is driven by the universal bearing 74 and rotates about the universal bearing 75. Since the flexible pipe 52 has elasticity, the connection pipe 53 will not disconnect from the flexible pipe 52 as it rotates around the universal bearing 75.

The second fixing frame 61 shown in FIG. 8 is similar to the first fixing frame 59 in FIG. 7. The driving motor 68 causes the flywheel 67 to rotate, which, in turn, makes the link pole 69 drive the fixing frame 61 in reciprocating motion along the second horizontal direction 72. This motion causes the connection pipe 53 to rock about the universal bearing 74. The flexible pipe 52 ensures that there is no breakage as the rigid pipe 53 moves about, and the sliding connection of the universal joint 74 ensures that there can be relative planar movement between the fixing frames 61, 59.

Figure 9:
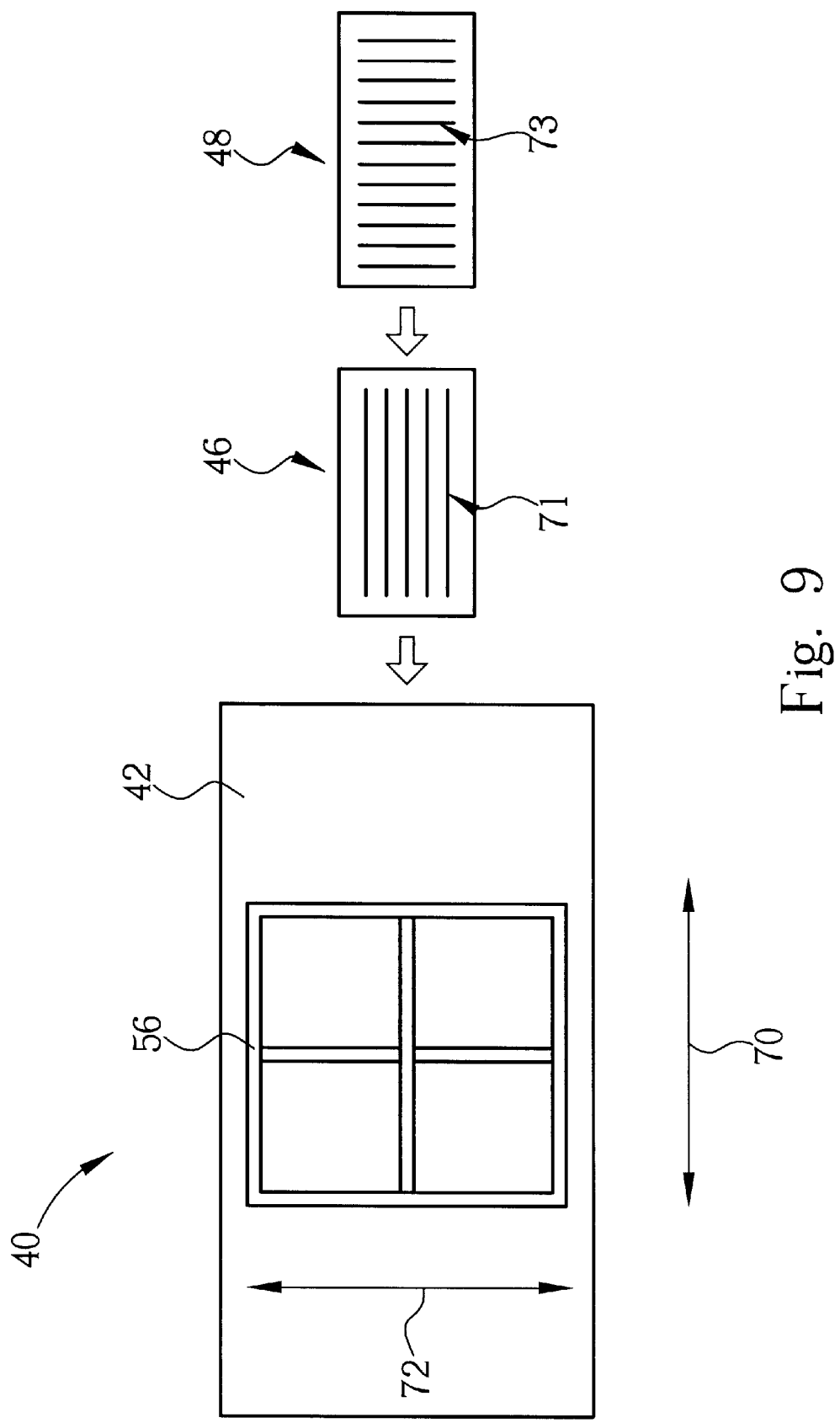
FIG. 9 is a schematic diagram of a front glass plate and a rear glass plate entering the liquid sprayer.

Please refer to FIG. 9. FIG. 9 is a schematic diagram showing a front glass plate 46 and a rear glass plate 48 of a plasma display panel entering the liquid sprayer 40. The liquid sprayer 40 is used to spray the front glass plate 46 and the rear glass plate 48 for an etching process. As shown in FIG. 9, sustaining electrodes 71 are on the surface of the front glass plate 46, and addressing electrodes 73 are on the surface of the rear glass plate 48. The orientation of the electrodes 71 is perpendicular to that of the electrodes 73. Due to the width limitation of the inner shell 42, the front and rear glass plates 46, 48 must enter the inner shell 42 in the same manner. When both glass plates sequentially enters the inner shell 42, the direction of the sustaining electrodes 71 on the front glass plate 46 is perpendicular to the direction of the addressing electrodes 73 on the rear glass plate.

When the liquid sprayer 40 is spraying etching liquid onto the front and the rear glass plates 46, 48, a user can control the driving device 60 to select appropriate spraying motion based upon the glass plate being sprayed. The liquid sprayer 40 sprays along the first horizontal direction 70 when spraying the front glass plate 46, and sprays along the second horizontal direction 72 when spraying the rear glass plate 48. Experiments are conducted and shows that when the spraying direction is parallel to the electrode line direction of the glass plate, the etching process performs very well. Process time and the amount of liquid are thus reduced, cutting down process costs.

When the liquid sprayer 40 is used for a workpiece covered with an exposed photoresist layer, the spraying liquid is a developing solution. The driving device 60 moves the nozzles 54 along different directions to spray the developing solution onto the workpiece to wash the photoresist layer. The liquid sprayer 40 can be applied widely. The application includes many kinds of cleaning and etching processes. The liquid sprayer 40 can be used, for example, in liquid crystal display factories, printed circuit board factories and plasma display panel factories. It can also be used in equipment such as Cr etchers, Cu etchers, strippers and developers.

In contrast to the prior art liquid sprayer 10, the liquid sprayer 40 has the linking device 56 which is driven by the drive mechanisms 60, 62, so the nozzles 54 move together in various directions. The nozzles of the liquid sprayer 40 can thus be directed to move in directions that match the various electrode line directions of the workpieces.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A liquid sprayer for spraying a liquid from a liquid source onto a workpiece comprising:

a supporting means for supporting the workpiece;

a plurality of transfer pipes installed above the supporting means for spraying the liquid downwardly;

a linking device connected to the plurality of transfer pipes such that all transfer pipes can be pointed in one direction simultaneously, and said direction is variable; and a driving device movably connected to the linking device for driving the linking device back and forth along at least two directions so that the plurality of transfer pipes are directed back and forth along at least two directions to spray the liquid onto the workpiece.

2. The liquid sprayer of claim 1 wherein the linking device includes a frame, a first track extended along a first direction, and a second track extended along a second direction, the first direction being substantially perpendicular to the second direction;

wherein the frame is slidably mounted on the first track, and the first track is slidably mounted on the second track, so that the frame can be driven by the driving device to slide on the first track along the first direction, or driven by the driving device to slide on the second track along the second direction.

3. The liquid sprayer of claim 1 wherein the linking device comprises a first fixing frame, a second fixing frame, the transfer pipe comprises a flexible pipe, and a rigid pipe, the flexible pipe being connected between the liquid source and the second fixing frame, the rigid pipe being connected between the first fixing frame and the second fixing frame; wherein a first end of the rigid pipe is rotably mounted on the second fixing frame, and a second end of the rigid pipe is slidably and rotably mounted on the first fixing frame, so that the rigid pipe can spray along a first direction in response to the movement of the first fixing frame, and the rigid pipe can spray along a second direction in response to the movement of the second fixing frame.

4. The liquid sprayer of claim 1 wherein the driving device comprises:

a first drive mechanism connected to the linking device, the first drive mechanism moving the linking device in a reciprocating manner along the first direction;

a first drive motor driving the first drive mechanism;

a second drive mechanism connected to the linking device, the second drive mechanism moving the linking device in a reciprocating manner along the second direction; and a second drive motor driving the second drive mechanism.

5. The liquid sprayer of claim 4 wherein both the first and the second drive mechanisms comprise a flywheel and a link pole, one end of the link pole is connected to the linking device and the other end of the link pole is connected to the peripheral portion of the flywheel; wherein the first and the second motors spin their individual flywheels to drive the link poles in a reciprocating manner so that the linking device is moved in a reciprocating manner in both the first and the second horizontal directions.

6. The liquid sprayer of claim 4 wherein the linking device further comprises a first fixing frame and a second fixing frame, the first drive mechanism is connected to the first fixing frame and moves the first fixing frame along the first horizontal direction in a reciprocating manner, and the second drive mechanism is connected to the second fixing frame and moves the second fixing frame along the second horizontal direction in a reciprocating manner.

7. The liquid sprayer of claim 6 wherein for each transfer pipe a universal bearing is used to rotably mount the transfer pipe to the first fixing frame, and another universal bearing is used to rotably mount the transfer pipe to the second fixing frame; wherein the transfer pipe is slidably mounted to one of the universal bearings, and is not slidably mounted to the other universal bearing.

8. The liquid sprayer of claim 1 further comprising a plurality of cylindrical pipes installed horizontally above the supporting means, the cylindrical pipes serving to transfer the liquid down to the transfer pipes, and the transfer pipes spray the liquid onto the workpiece.

9. The liquid sprayer of claim 1 wherein the liquid is a developing solution, and an exposed photoresist layer is positioned on the workpiece; wherein the driving device moves the transfer pipes along different directions to spray the developing solution onto the workpiece to wash the photoresist layer.

* * * * *